(12) United States Patent
Chang et al.

(10) Patent No.: US 10,381,239 B2
(45) Date of Patent: Aug. 13, 2019

(54) METHOD OF FORMING SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/104,948

(22) Filed: Aug. 19, 2018

(65) Prior Publication Data

US 2019/0109013 A1     Apr. 11, 2019

(30) Foreign Application Priority Data

Oct. 10, 2017 (CN) .......................... 2017 1 0934059

(51) Int. Cl.
*H01L 21/20* (2006.01)
*H01L 21/311* (2006.01)
*H01L 49/02* (2006.01)

(52) U.S. Cl.
CPC ........ *H01L 21/31144* (2013.01); *H01L 28/40* (2013.01)

(58) Field of Classification Search
CPC ......... H01L 21/02164; H01L 21/02238; H01L 21/76227; H01L 21/31144; H01L 28/40
USPC .......................................................... 438/386
See application file for complete search history.

(56) References Cited

U.S. PATENT DOCUMENTS

| | | | |
|---|---|---|---|
| 5,007,982 A | 4/1991 | Tsou | |
| 5,200,028 A | 4/1993 | Tatsumi | |
| 6,465,360 B2 * | 10/2002 | Yang | H01L 21/0271 257/E21.024 |
| 7,435,354 B2 * | 10/2008 | Huang | G03F 7/405 216/58 |
| 2008/0045033 A1 * | 2/2008 | Wang | H01L 21/0271 438/736 |
| 2012/0149195 A1 | 6/2012 | Kuniya | |

* cited by examiner

*Primary Examiner* — David S Blum
(74) *Attorney, Agent, or Firm* — Winston Hsu

(57) ABSTRACT

A method of forming a semiconductor device includes following steps. First of all, a substrate is provided, and a stacked structure is formed on the substrate. Then, a patterned silicon-containing mask layer is formed on the stacked structure, and the stacked structure is partially removed through the patterned silicon-containing mask layer, to form plural openings in the stacked structure. Following these, a bromine covering process is performed, to form a bromide layer on a portion of the patterned silicon-containing mask layer, and a bromide sublimation process is then performed, to completely remove the bromide layer.

10 Claims, 4 Drawing Sheets

METHOD OF FORMING SEMICONDUCTOR DEVICE

BACKGROUND OF THE INVENTION

1. Field of the Invention

The present invention generally relates to the field of forming semiconductor devices, and more particularly to a method of forming openings with a high aspect ratio in a stacked structure.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For these purposes, in conventional semiconductor techniques, a mask layer is formed on the target, and these tiny elements are defined in the mask layer and followed by being transferred to the target layer. Generally, the mask layer may include or is formed by means of a layer of photoresist that is patterned by lithographic process and/or patterned hard mask including the patterns transferred from the patterned photoresist.

As feature sizes are decreased by the complexity of currently integrated circuits, the fabrication process and the design thereof have met its bottleneck to successfully render the features. Also, the successfully formed features in the target may be damaged while removing the mask layer, thereby further reducing the elemental performance. Therefore, it is still urgent to those of skilled in the art to develop or improve the conventional scheme for these tiny elements.

SUMMARY OF THE INVENTION

One object of the present invention is to provide a method of forming a semiconductor device, in which, the openings with a high aspect ratio are easily to be defined under a simplified process by using the silicon-containing mask layer. Also, the silicon-containing mask layer is allowable to be removed then without over-etching the openings, so that the openings may obtain vertical sidewalls thereby.

To achieve the purpose described above, the present invention provides a method of forming a semiconductor device including the following steps. Firstly, a substrate is provided and a stacked structure is formed on the substrate. Then, a patterned silicon-containing mask layer is formed on the stacked structure, and the stacked structure is partially removed through the patterned silicon-containing mask layer, to form a plurality of openings in the stacked structure. Following these, a bromine covering process is performed, to from a bromide layer on surfaces of the patterned silicon-containing mask layer, and then, a bromide sublimation process is performed, to completely remove the bromide layer.

Overall, the present invention provides a method of effectively removing the silicon-containing mask layer, in which, the silicon-containing mask layer is removed by repeatedly performing a bromine covering process and a bromide sublimation process, so as to successfully remove the silicon-containing mask layer in a peeling manner. In this way, the openings defined underneath are free from aforementioned damage which is generated during the silicon-containing mask layer is removed, and also, the sidewalls of the openings are further protected by the bromine-containing gas of the bromine covering process. Thus, through the method of the present invention not only can improve the possible defects, but also can obtain the semiconductor device with a preferably structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic diagrams illustrating a method of forming a semiconductor device according to a preferred embodiment of the present invention, wherein:

FIG. 1 shows a cross-sectional view of a semiconductor device at the beginning of the forming process;

FIG. 2 shows a cross-sectional view of a semiconductor device after forming an opening;

FIG. 3 shows a cross-sectional view of a semiconductor device after removing an oxide layer;

FIG. 4 shows a cross-sectional view of a semiconductor device after performing a bromine covering process;

FIG. 5 shows a cross-sectional view of a semiconductor device after performing a bromide sublimation process; and FIG. 6 shows a cross-sectional view of a semiconductor device after removing the silicon-containing mask layer.

FIG. 7 to FIG. 8 are schematic diagrams illustrating a method of forming a semiconductor device according to a preferred embodiment of the present invention being used in a forming process of a semiconductor memory device, wherein:

FIG. 7 shows a cross-sectional view of a semiconductor memory device after forming a capacitor opening; and FIG. 8 shows a cross-sectional view of a semiconductor memory device after forming a capacitor structure.

DETAILED DESCRIPTION

To provide a better understanding of the present invention, preferred embodiments will be described in detail. The preferred embodiments of the present invention are illustrated in the accompanying drawings with numbered elements.

Figure 1:
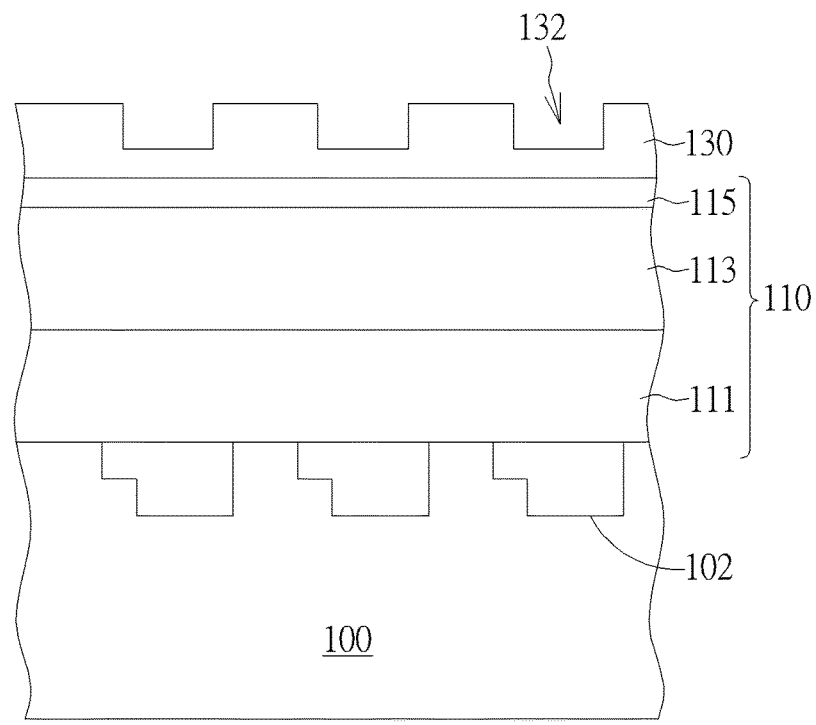

Referring to FIGS. 1-6, FIGS. 1-6 illustrate a method of forming a semiconductor device according to a preferred embodiment of the present invention. As shown in FIG. 1, a substrate layer 100 is provided, and which may include a semiconductor substrate (not shown in the drawings) like a silicon substrate, a silicon-containing substrate, an epitaxial silicon substrate or a silicon-on-insulator (SOI) substrate, and/or a dielectric layer (not shown in the drawings) including silicon oxide ($SiO_x$), silicon nitride (SiN) or silicon oxynitride (SiON) stacked on the semiconductor substrate, but is not limited thereto. Also, at least one conductive structure 102 is formed in the substrate layer 100, and the conductive structure 102 may be an active element like a transistor being formed on the semiconductor substrate or within the semiconductor substrate, or a plug or wire being formed in the dielectric layer. In the present embodiment, three conductive structures 102 are formed as shown in FIG. 1, and the surface of each of the conductive structure 102 is exposed from the top surface of the substrate layer 100. It is noted that, the aforementioned number of the conductive structure is only for exemplified but not limited thereto, and practical number and the disposed position of the conductive structure may be further adjusted according to the practical requirements of the product.

Next, a stacked structure 110 and a patterned mask layer 130 are formed on a top surface of the substrate layer 100. The stacked structure 110 includes plural films with various materials alternately stacked on one over another, and which may include a first layer 111 for example including borophosphosilicate glass (BPSG), a second layer 113 for example including silicon dioxide ($SiO_2$), a third layer 115 for example including SiN, from bottom to top. The patterned mask layer 130 preferably includes a material with a great etching selectivity related to each film of the stacked structure 110, for example a silicon-containing layer including amorphous silicon (a-Si), pure silicon or polysilicon (p-Si), but is not limited thereto. In the present embodiment, although the stacked structure 110 with three stacked films is exemplified, the stacked structure of the present invention is not limited thereto, and the practical number, the material and the stacking order of the stacked films may be further adjusted according the produce requirements in other embodiment.

Precisely speaking, at least one pattern opening such as three pattern openings 132 as shown in FIG. 1 are defined in the patterned mask layer 130, and each of the pattern openings 132 do not penetrate through two opposite surfaces of the patterned mask layer 130. The formation of the patterned mask layer 130 for example includes the following steps. First of all, a mask layer (not shown in the drawings) is formed on the stacked structure 110, a photoresist structure (not shown in the drawings) is then formed on the mask layer with the photoresist structure including an organic dielectric layer (ODL, not shown in the drawings), a silicon-containing hard mask (SHB) layer (not shown in the drawings) and a photoresist layer such as a KrF photoresist (not shown in the drawings) stacked one over another, and an etching process is performed to transfer patterns of the photoresist layer into the SHB layer, the ODL and a portion of the mask layer, thereby forming the patterned mask layer 130 and the pattern openings 132 as shown in FIG. 1.

Figure 2:
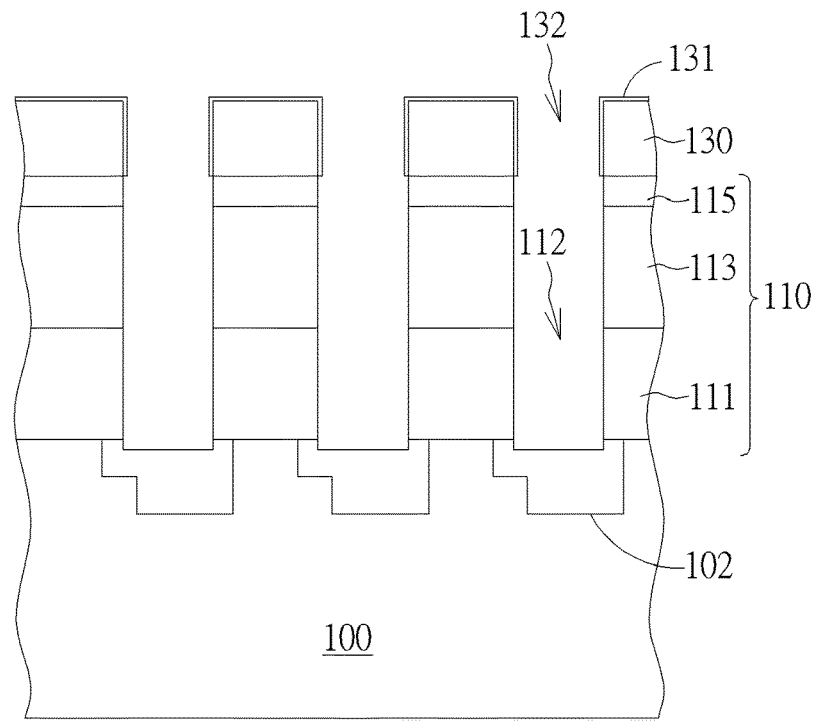

Then, another etching process is performed under the coverage of the photoresist structure, to firstly transfer the pattern openings 132 into the entire patterned mask layer 130, further into the stacked structure 110 underneath, so as to form corresponding openings 112 in the stacked structure 110, as shown in FIG. 2. After forming the openings 112, the photoresist structure is completely removed. It is noted that, as the pattern openings 132 are formed at the beginning, surfaces of the patterned mask layer 130 are partially exposed, and are further reacted with atmosphere in the environment, to form a protection layer (not shown in the drawings) thereby. Accordingly, while the pattern openings 132 are further transferred to the entire patterned mask layer 130 and the photoresist structure is removed, more surfaces of the patterned mask layer 130 are exposed and reacted with atmosphere in the environment, so as to evenly form a protection layer 131 on the exposed surfaces, as shown in FIG. 2. The protection layer 131 may include an oxide layer such as silicon oxide.

The etching process is for example a dry etching process, and which is performed by using the patterned mask layer 130 as an etching mask to sequentially etch each stacked film of the stacked structure 110. In one embodiment, the dry etching process is performed by using difluoromethane ($CH_2F_2$), fluoroform ($CHF_3$), and argon (Ar)/oxygen ($O_2$) to etch each stacked film under a low pressure and high bias condition. In this way, each of the opening 112 formed in the stacked structure 110 may therefore have a high aspect ratio and vertical sidewalls as shown in FIG. 2.

Figure 3:
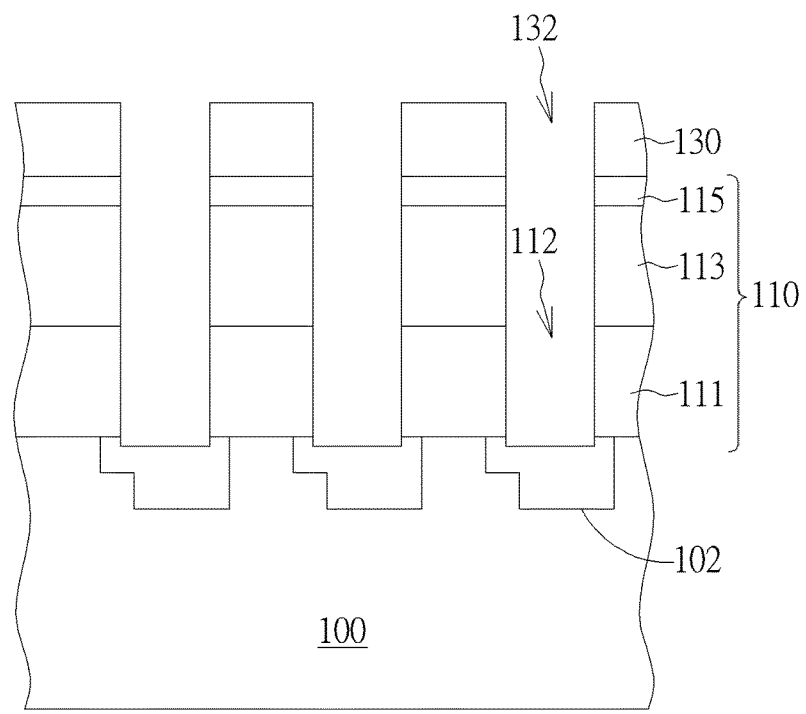
Figure 4:
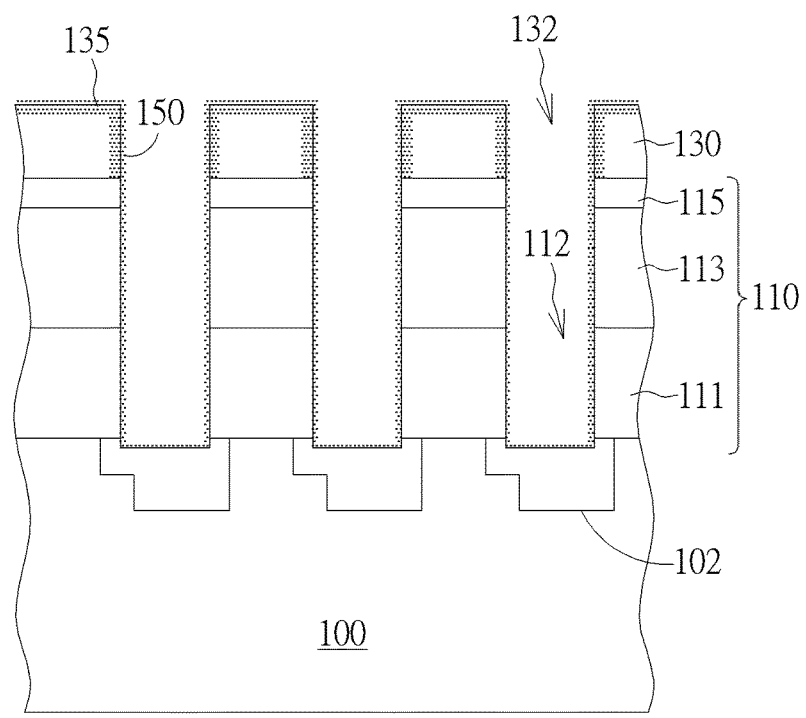

After that, a removing process of the patterned mask layer 130 is performed. The removing process of the patterned mask layer 130 is preferably performed within a vacuum machine (not shown in the drawings), and which is carried out by firstly performing an etching process such as a dry etching process, providing an etchant gas like tetrafluoromethane ($CF_4$) to completely remove the protection layer 131 formed on surfaces of the patterned mask layer 130, as shown in FIG. 3. Then, a bromine (Br) covering process is performed by providing a bromine containing gas such as a mixed gas of a hydrogen bromide (HBr) gas and a chlorine ($Cl_2$) gas under a condition without bias, with the provided hydrogen bromide gas 150 evenly covering the exposed surfaces of the patterned mask layer 130 and the stacked structure 110, as shown in FIG. 4.

It is noted that, the provided hydrogen bromide gas 150 further reacts with the exposed surfaces of the patterned mask layer 130 as shown in Step 1, so that, the exposed surfaces of the patterned mask layer 130 may therefore be transformed into a bromide layer 135. In other words, the provided hydrogen bromide gas 150 and silicon within the silicon-containing material (such as amorphous silicon) of the patterned mask layer 130 are reacted with each other, so as to transform a portion (namely, the outer surface thereof) of the patterned mask layer 130 to form the uniformed bromide layer 135, as shown in FIG. 4. On the other hand, since each stacked film of the stacked structure 110 does not include silicon, the provided hydrogen bromide gas may only cover on the exposed surfaces of the stacked structure 110 for protection instead of reacting with thereto. In this way, the sidewalls of the openings 112 are protected thereby.

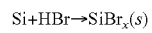
Si+HBr→SiBr$_x$(s)　　　　　　　　　　　　Step 1

Figure 5:
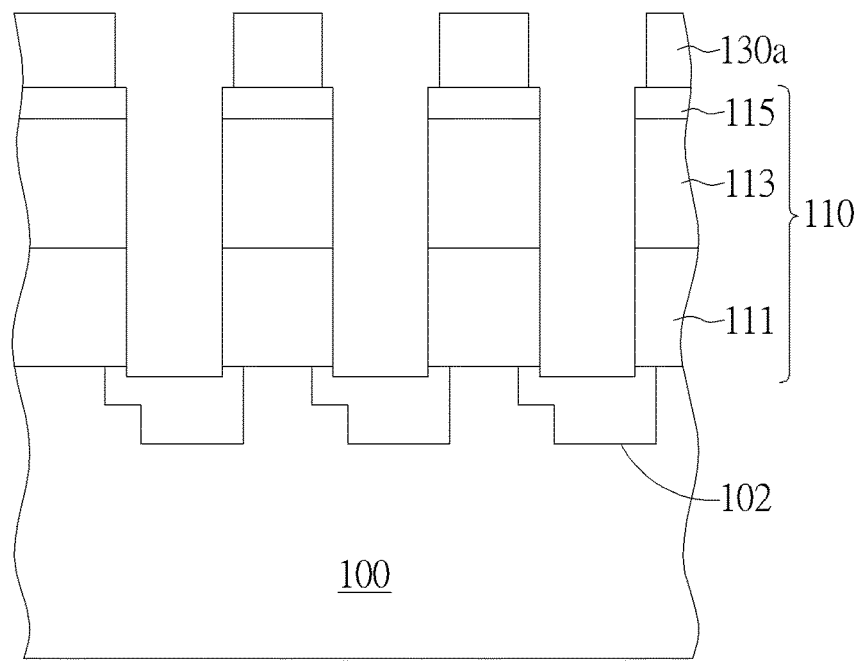

Following these, a bromide sublimation process is performed to completely remove the bromide layer 135 formed in the bromine covering process. In one embodiment, the bromide sublimation process is also performed under a condition without bias, and which is carried out by providing a hydrogen-containing gas, with the bromide layer 135 being catalyzed by the hydrogen-containing gas to react as shown in Step 2. Accordingly, the bromide layer 135 may be sublimated directly to a bromine ($Br_2$) gas or a silicon bromide (SiBr) gas, so as to completely remove the bromide layer 135 thereby. In other words, the outer surfaces of the patterned mask layer 130 are therefore removed, to leave the unreacted portion of the patterned mask layer 130a (namely, the inner portion of the patterned mask layer 130) remained on the stacked structure 110, as shown in FIG. 5. On the other hand, the hydrogen bromide gas 150 covered on the surfaces of the stacked structure 110 are also removed during the bromide sublimation process, without remaining on the stacked structure 110.

SiBr$_x$(s)→SiBr$_y$(g)+Br$_y$(g)　　　　　　　　Step 2

Figure 6:
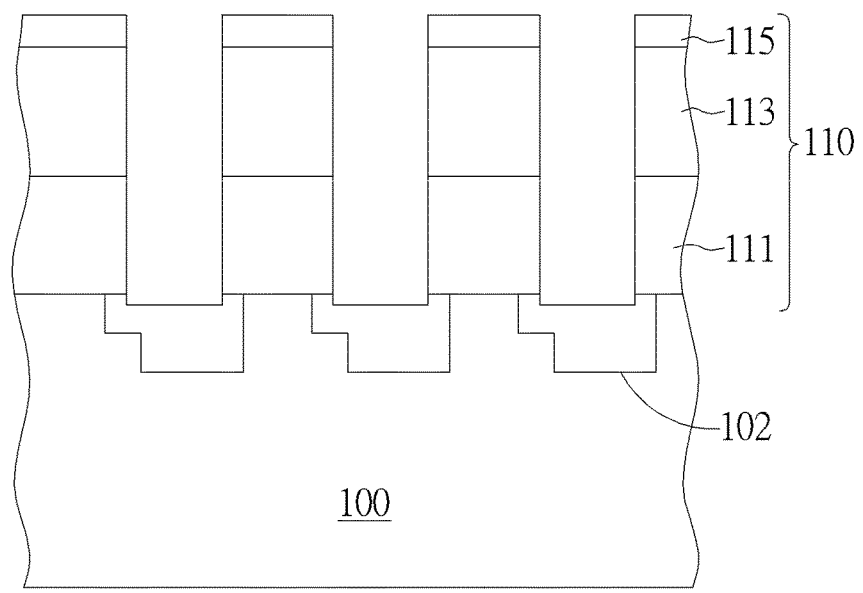

In the subsequent process, the bromine covering process and the bromide sublimation process may be repeatedly performed to further remove the rest portion of the patterned mask layer 130a by firstly transforming the outer portion thereof into a bromide layer (not shown in the drawings) through the bromine covering process and then removing the bromide layer through the bromide sublimation process. Through repeatedly performing the bromine covering process and the bromide sublimation process, each portion of the patterned mask layer 130a may be gradually removed till completely removing the entire patterned mask layer 130, as shown in FIG. 6.

Thus, the method of forming the semiconductor device according to the preferred embodiment of the present invention is accomplished. According to the method of the present embodiment, the silicon-containing patterned mask layer 130 is used to define the openings 112 in the stacked structure 110, and the silicon-containing patterned mask layer 130 is then gradually removed by repeatedly performing the bromine covering process and the bromide sublimation process. In other words, the method of the present embodiment removes the silicon-containing patterned mask layer 130 in a peeling manner instead of using etching directly. Precisely, in each step of the bromine covering process, a proper amount of the bromine gas is provided to react with the outer surfaces of the silicon-containing patterned mask layer 130, to transform the outer surfaces of the silicon-containing patterned mask layer 130 into the bromide layer 135. In each step of the bromide sublimation process, a proper amount of the hydrogen-containing gas is provided to catalyze the sublimation of the bromide layer 135, thereby removing the transformed outer surfaces of the silicon-containing patterned mask layer 130. Through this way, is it sufficient to avoid the possible damages such as being over-etched or expanded to the openings 112 while etching the silicon-containing patterned mask layer 130, and also to further protect the sidewalls of the openings 112 by using the bromine-containing gas of the bromine covering process, so as to achieve a better performance.

Due to the aforementioned embodiment, the method of the present invention is allowable to avoid the silicon-containing mask layer being removed by etching, so that, the openings defined under the silicon-containing mask layer are therefore free from any possible damages like overetching. Thus, the method of the present invention may be practically used in a fabrication process of a semiconductor device such as a semiconductor memory device like a dynamic random access memory (DRAM) device, so as to preferably remove a mask layer for defining each storage node fins.

Figure 7:
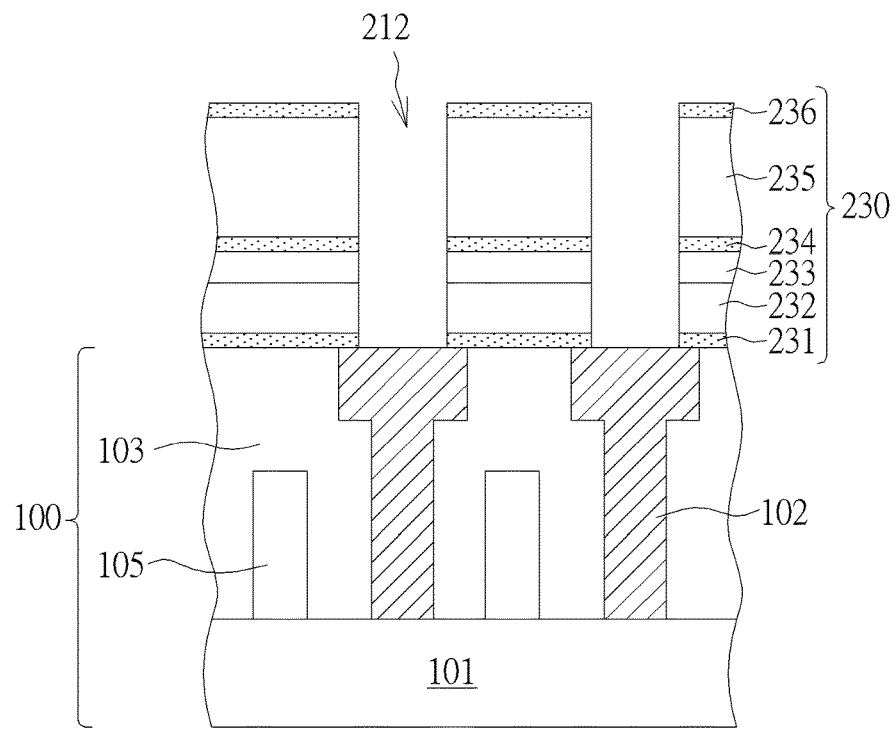

In one embodiment, the substrate layer 100 may include a semiconductor substrate 101 like a silicon substrate, and a dielectric layer 103 such as including SiN formed on the semiconductor substrate 101, and a buried transistor structure (not shown in the drawings) is formed within the semiconductor substrate 101 to function like a word line (WL). In the present embodiment, the conductive structure 102 for example includes a plurality of plug structures formed in the dielectric layer 103, with each of the plug structures includes a plug (not shown in the drawings) disposed at the bottom thereof and a conductive pad (not shown in the drawings) disposed at the top thereof, with the plugs being directly in contact with a portion of the semiconductor substrate 101 to function like a storage node contact (SNC) and with the conductive pads being function like a storage node pad (SN pad), as shown in FIG. 7.

Also, a plurality of bit line (BL) structures 105 is further formed in the dielectric layer 103. The bit line structures 105 are electrically connected to a source/drain region (not shown in the drawings) of the buried transistor structure through a bit line contact (BLC, not shown in the drawings) formed below the bit line structures 105, and the plug structures (namely the conductive structure 102) are electrically connected to another source/drain region (not shown in the drawings) of the buried transistor structure, so that, the buried transistor structure of the semiconductor memory device may therefore accept signals from the bit line structures 105 and the word line during the operation.

Precisely speaking, the stacked structure 230 of the present embodiment also includes plural films with various materials alternately stacked on one over another, and which includes a first layer 231 for example including silicon nitride, a second layer 232 for example including borophosphosilicate glass, a third layer 233 for example including silicon dioxide, a fourth layer 234 for example including silicon nitride, a fifth layer 235 for example including silicon oxide, and a sixth layer 236 for example including silicon nitride, from bottom to top, but not limited thereto. Then, the processes as shown in FIGS. 1-6 are sequentially performed, by using a silicon-containing mask layer (not shown in the drawings) to define a plurality of capacitor openings 212 in the stacked structure 230 to expose each plug structure (namely the conductive structure 102) formed within the dielectric layer 103 respectively. After forming the capacitor openings 212, the bromine covering process and the bromide sublimation are repeatedly performed to completely remove the silicon-containing layer without damaging to the sidewalls of each capacitor opening 212.

Figure 8:
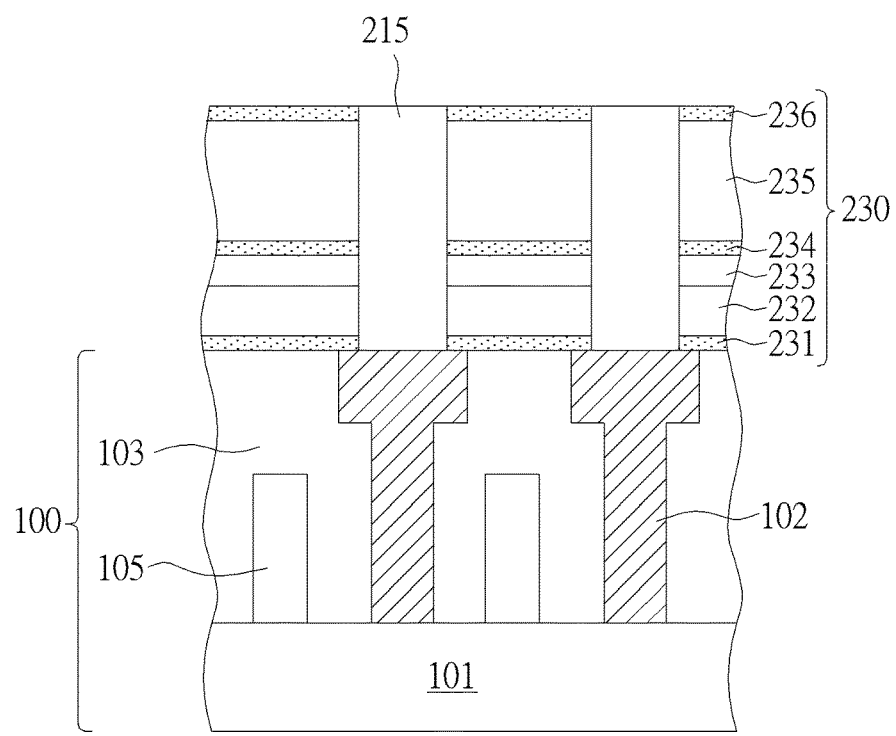

Following these, a deposition process and a planarization process are sequentially performed, as shown in FIG. 8, to form a capacitor 215 in each of the capacitor openings 212. The capacitor 215 for example includes a bottom electrode (not shown in the drawings), a capacitor dielectric layer including a dielectric material with a dielectric constant greater than 4, such as hafnium oxide ($HfO_2$, not shown in the drawings), and a top electrode (not shown in the drawings). The top electrode and the bottom electrode are both include a conductive material like tungsten (W), titanium (Ti), titanium nitride (TiN), tantalum (Ta), tantalum nitride (TaN) and aluminum (Al). Through the aforementioned processes, the fabrication process of the present embodiment is allowable to avoid the possible damages to the sidewalls of the capacitor openings 212 during removing the silicon-containing mask layer, so as to form the capacitors 215 with improved structure and function to maintain a preferably capacitance value.

Overall speaking, the present invention provides a method of effectively removing the silicon-containing mask layer, in which, the silicon-containing mask layer is removed by repeatedly performing a bromine covering process and a bromide sublimation process, so as to successfully remove the silicon-containing mask layer via a peeling manner. In this way, the openings defined underneath are free from the aforementioned damage which is generated during the silicon-containing mask layer is removed, and also, the sidewalls of the openings are further protected by the bromine-containing gas of the bromine covering process. Thus, through the method of the present invention not only can improve the possible defects, but also can obtain the semiconductor device with a preferably structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   providing a substrate;
   forming a stacked structure on the substrate;
   forming a patterned silicon-containing mask layer on the stacked structure;

partially removing the stacked structure through the patterned silicon-containing mask layer, to form a plurality of openings in the stacked structure;

performing a bromine covering process, to from a bromide layer on surfaces of the patterned silicon-containing mask layer; and performing a bromide sublimation process, to completely remove the bromide layer.

2. The method of forming the semiconductor device according to claim 1, further comprising:

repeatedly performing the bromine covering process and the bromide sublimation process, to completely remove the patterned silicon-containing mask layer.

3. The method of forming the semiconductor device according to claim 1, wherein the bromine covering process and the bromide sublimation process are performed without bias.

4. The method of forming the semiconductor device according to claim 1, wherein the bromide sublimation process is performed by providing a hydrogen-containing gas to react with the bromide layer.

5. The method of forming the semiconductor device according to claim 1, wherein after the bromide sublimation process, a silicon bromide gas and a bromine gas are formed.

6. The method of forming the semiconductor device according to claim 1, wherein before the bromide covering process, further comprises:

forming an oxide layer on exposed surface of the patterned silicon-containing mask layer; and performing an etching process to remove the oxide layer.

7. The method of forming the semiconductor device according to claim 6, wherein the etching process is performed by providing tetrafluoromethane ($CF_4$).

8. The method of forming the semiconductor device according to claim 1, further comprising:

forming a dielectric layer on the substrate, the dielectric layer comprising a plurality of plugs formed therein, and top surfaces of the plugs being exposed from the openings.

9. The method of forming the semiconductor device according to claim 8, further comprising:

after completely removing the patterned silicon-containing mask layer, forming a plurality of capacitors in the openings to electrically connect to the plugs respectively.

10. The method of forming the semiconductor device according to claim 1, wherein the patterned silicon-containing mask layer comprises pure silicon or amorphous silicon.

* * * * *